(12) United States Patent
Yeh (10) Patent No.: US 7,633,417 B1
(45) Date of Patent: Dec. 15, 2009

(54) DEVICE AND METHOD FOR ENHANCING THE HUMAN PERCEPTUAL QUALITY OF A MULTIMEDIA SIGNAL

(75) Inventor: Chiang Yeh, Sierra Madre, CA (US)

(73) Assignee: Alcatel Lucent, Paris (FR)

( * ) Notice: Subject to any disclaimer, the term of this patent is extended or adjusted under 35 U.S.C. 154(b) by 552 days.

(21) Appl. No.: 11/445,864

(22) Filed: Jun. 3, 2006

(51) Int. Cl.
H03M 1/20 (2006.01)

(52) U.S. Cl. .................. 341/131; 341/139; 341/144; 341/185

(58) Field of Classification Search ......... 341/144–154, 341/131, 185
See application file for complete search history.

(56) References Cited

U.S. PATENT DOCUMENTS

| | | | | |
|---|---|---|---|---|
| 5,490,233 | A * | 2/1996 | Kovacevic | 704/230 |
| 6,011,501 | A * | 1/2000 | Gong et al. | 341/150 |
| 6,201,486 | B1 * | 3/2001 | Chan et al. | 341/61 |
| 6,380,879 | B2 * | 4/2002 | Kober et al. | 341/155 |
| 6,411,647 | B1 * | 6/2002 | Chan | 375/216 |
| 6,546,057 | B1 * | 4/2003 | Yeap | 375/285 |
| 6,549,151 | B1 * | 4/2003 | Kober et al. | 341/141 |
| 6,724,335 | B1 * | 4/2004 | Gomez et al. | 341/144 |
| 6,732,070 | B1 * | 5/2004 | Rotola-Pukkila et al. | 704/219 |
| 6,922,160 | B1 * | 7/2005 | Brown | 341/110 |
| 7,236,757 | B2 * | 6/2007 | Raghavan et al. | 455/203 |
| 7,348,909 | B2 * | 3/2008 | Ozalevli et al. | 341/144 |
| 7,463,170 | B2 * | 12/2008 | Kong et al. | 341/61 |
| 2003/0198339 | A1 * | 10/2003 | Roy et al. | 379/387.01 |
| 2004/0222908 | A1 * | 11/2004 | MacDonald et al. | 341/144 |
| 2008/0272948 | A1 * | 11/2008 | Dabag et al. | 341/144 |

OTHER PUBLICATIONS

Vaidayanathan, P.P. "Theory and Design of M-Channel Maximally Decimated Quadrature Mirror Filters with Arbitrary M, Having Perfect-Reconstruction Property", IEEE Transactions on Acoustics, Speech and Signal Processing, ASSP-35, No. 4, pp. 476-492, Apr. 1987.
Vitterli, M. "A Theory of Multirate Filter Banks", IEEE Transactions on Acoustics, Speech and Signal Processing, ASSP-35, No. 3, pp. 356-372, Mar. 1987.
Strang, G. & Nguyen, T.Q. "Wavelets and Filter Banks", Cambridge, MA, Wesley Cambridge Press, chpts. 5, 7 and 9, 1996.
Cholakis, E, "Pure Space Reverb Impulses by Numerical Sound", Apr. 2005 http://www.numericalsound.com/purespac.html.

* cited by examiner

*Primary Examiner*—Linh V Nguyen
(74) *Attorney, Agent, or Firm*—The Capitol Patent & Trademark Law Firm, PLLC (57) ABSTRACT

A device is described herein that performs a digital-to-analog conversion on a digital multimedia signal in a manner that enhances the human perceptual quality of the resulting analog multimedia signal (e.g., musical passage). In one embodiment, the device operates as follows: (1) divides the bitstream of a digital multimedia signal into several distinct multimedia bitstreams; (2) applies the most effective signal processing (filtering and noise shaping) to each distinct multimedia bitstream; (3) performs the most appropriate digital-to-analog conversion (using a multi-bit DAC, a bitstream DAC, a oversampled bitstream DAC, or a hybrid of these DACs) to each distinct multimedia bitstream; and (4) combines all of the analog multimedia signals which are outputted by the DACs into a single analog multimedia signal.

20 Claims, 4 Drawing Sheets

DEVICE AND METHOD FOR ENHANCING THE HUMAN PERCEPTUAL QUALITY OF A MULTIMEDIA SIGNAL

TECHNICAL FIELD

The present invention is related to a device for performing a digital-to-analog conversion on a digital multimedia signal in a manner that enhances the human perceptual quality of the resulting analog multimedia signal (e.g., musical passage).

BACKGROUND

Digital-to-Analog Conversion (DAC) is an important part of signal processing especially since there are more and more engineers/designers choosing to operate on a signal in the digital domain rather than in the analog domain, as low cost, high performance digital signal processors are becoming widely available. This trend is especially prevalent among multimedia engineers/designers who are in the music and video industries, because of the advent of dense compression, 3D images, and panoramic displays, etc. . . . . However, no matter how much a multimedia engineer/designer digitally processes a multimedia signal, the human sensory perception of the processed multimedia signal is still based on simple low frequency, analog mechanisms. Thus, the DAC itself becomes an important, and often limiting, factor in the field of multimedia signal processing. The two most common types of DACs used today include a multi-bit DAC and a bitstream DAC each of which have unique advantages and distinct drawbacks when performing a digital-to-analog conversion. A discussion about these DACs and their associated advantages and drawbacks are provided below with respect to FIGS. 1-2 (PRIOR ART).

Figure 1A:
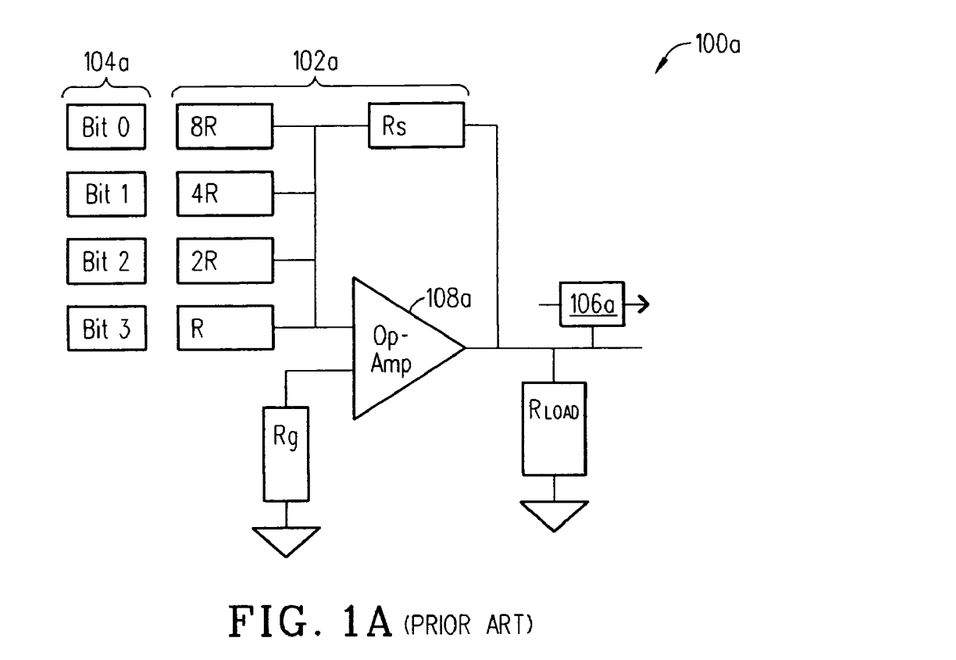
FIGS. 1A-1B (PRIOR ART) are block diagrams which illustrate the basic components of known multi-bit DACs.

FIG. 1A (PRIOR ART) is a block diagram of an exemplary multi-bit DAC 100a which uses a voltage summing amplifier 102a to convert a 4-bit unsigned multimedia signal 104a into an analog multimedia signal 106a. The voltage summing amplifier 102a includes a network of resistors R, 2R, 4R, 8R, $R_s$, $R_g$ and $R_{Load}$ and an op-amplifier 108a (a detailed discussion about this particular configuration is not provided herein since it is well known to those skilled in the industry). If one observes the relationship between the values of the summing resistors R, 2R, 4R, 8R and the 4-bit multimedia signal 104a, then one can see how there would be a problem if a 16-bit multimedia signal 104a (for example) needed to be converted into an analog multimedia signal 106a since the ratio between the largest resistance and the smallest resistance would be as large as 65,536. Thus, this particular multi-bit DAC 100a suffers from manufacturing issues which are caused by the difficulty in manufacturing the various resistors needed to handle a large multimedia signal 104a. Today, this is especially true since many audio/video standards require 24+bit resolution which means that the multi-bit DAC 100a would need to have a very wide range of resistors to handle the dynamic range of a 24+bit multimedia signal 104a.

Figure 1B:
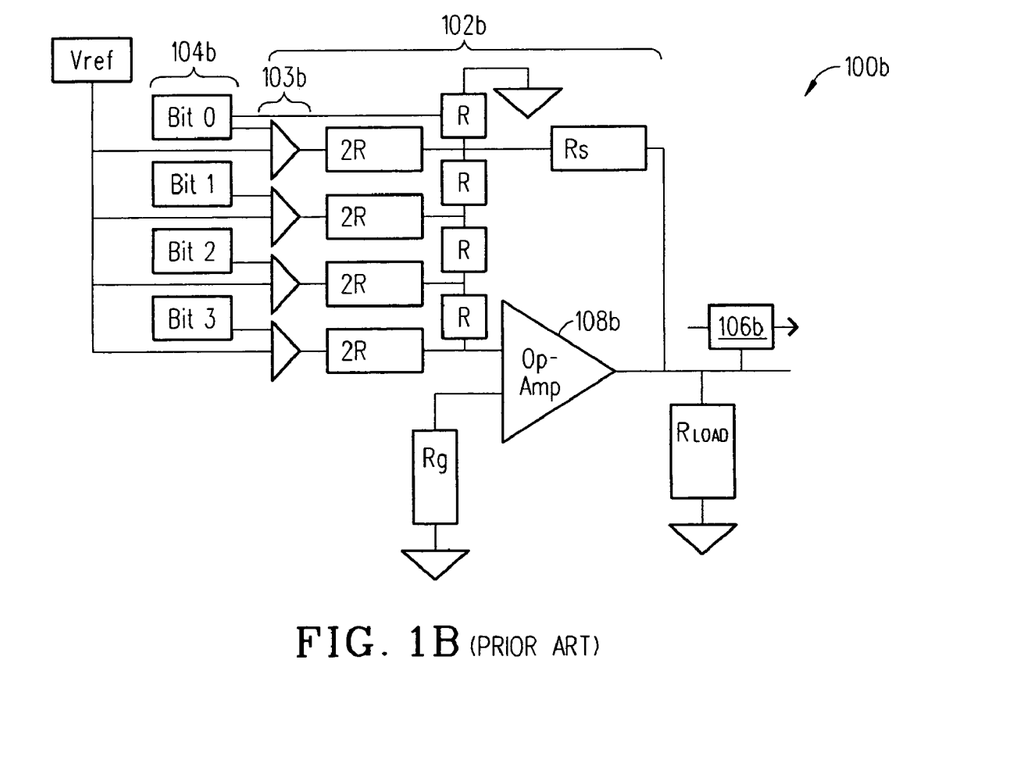

FIG. 1B (PRIOR ART) is a block diagram of an alternative multi-bit DAC 100b which has been developed to address the aforementioned resistance ratio problem. In this example, the multi-bit DAC 100b utilizes a voltage summing amplifier 102b to convert a 4-bit unsigned multimedia signal 104b into an analog multimedia signal 106b. The voltage summing amplifier 102b includes multiple R-2R networks (four shown), logic switches 103b (four shown), resistors $R_s$, $R_g$ and $R_{Load}$ and an op-amplifier 108b. This arrangement uses a small logic switch 103b at each bit input to avoid the extreme high-to-low resistor ratio which is the main problem with the previous multi-bit DAC 100a. Each logic switch 103b is configured to output Vref if the corresponding bit is 1 and to shut-off when the corresponding bit is 0. In this way, the multi-bit DAC 100b can use the R-2R combination repeatedly throughout the whole implementation and still produce a suitable analog multimedia signal 106b. A detailed discussion about the configuration of the multi-bit DAC 100b is not provided herein because this particular configuration is well known to those skilled in the industry.

Figure 2A:
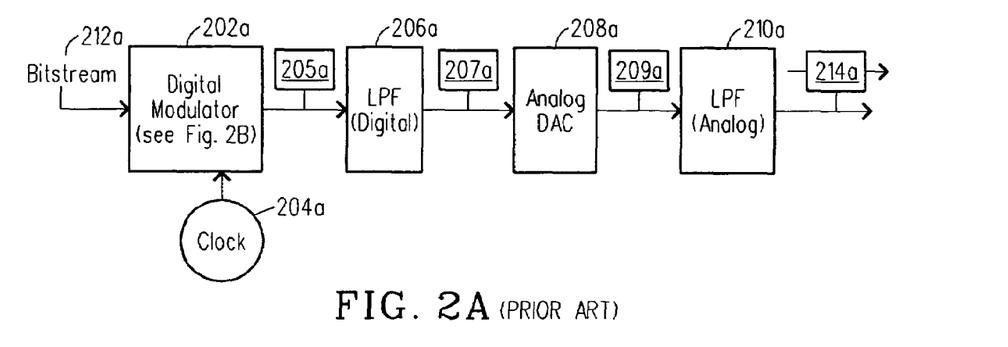
FIGS. 2A-2C (PRIOR ART) are block diagrams which illustrate the basic components of known bitstream DACs.

An alternative and increasingly popular approach for performing a digital-to-analog conversion is to use the bitstream DAC 200a. FIG. 2A (PRIOR ART) is a block diagram of an exemplary bitstream DAC 200a which includes a digital modulator 202a, a clock 204a, a digital low pass filter (LPF) 206a, an analog DAC 208a and an analog LPF 210a. The digital modulator 202a (with the aid of the clock 204a) transcodes the digital bits of a multimedia signal 212a into a pulse train 205a (or series of pulses 205a). The digital LPF 206a filters the pulse train 205a and the analog DAC 208 (typically 1-bit analog DAC 208) converts the filtered pulse train 207a into an analog signal 209a. Thereafter, the analog LPF 210a filters the analog signal 209a and outputs a filtered analog signal 214a.

Figure 2B:
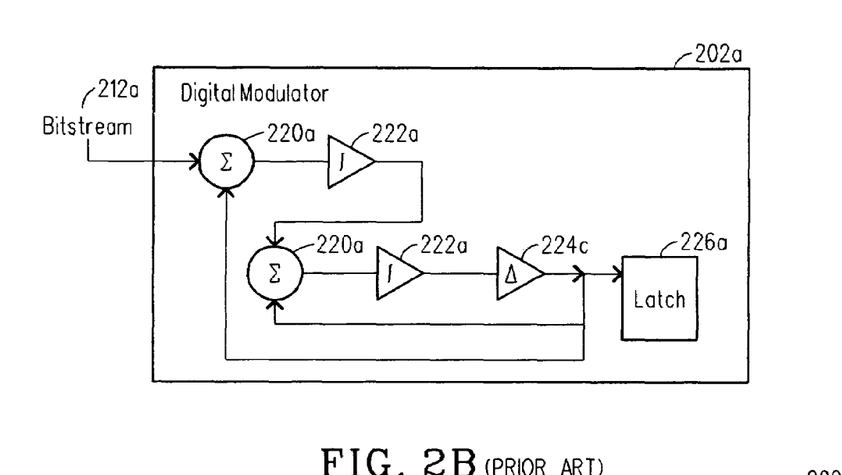

The digital modulator 202a uses a modulation scheme to produce a suitable pulse train 205a from the digital multimedia signal 212a. The most prevalent modulation scheme which is used today is known as sigma delta modulation. FIG. 2B (PRIOR ART) illustrates a digital modulator 202a which implements a $2^{nd}$ order sigma delta modulation scheme. As shown, this particular digital modulator 202a includes two summers 220a, two integrators 222a, a comparator 224a and a latch 226a. If desired, the digital modulator 202a could incorporate a higher order sigma delta digital modulator which would be built on multiple cascading/recursive low order sigma delta modulators. A detailed discussion about the $2^{nd}$ order sigma delta modulator 202a and higher order sigma delta modulators 202a is not provided herein because these configurations are well known to those skilled in the industry.

Referring again to FIG. 2A (PRIOR ART), the digital modulator 202a (or the sigma delta digital modulator 202a) outputs a pulse train 205a that is filtered/processed by the digital LPF 206a, the analog DAC 208a and the analog LPF 210a to generate the resulting analog signal 214a. However, it can be difficult to separate the desired frequency band from the neighboring frequency band in the multimedia signal by using simple LPFs 206a and 210a. As a result, a portion of the undesired neighboring frequency band is often mixed in with the resulting analog signal 214a. This effect is called aliasing. One way to deal with aliasing is to use oversampling. The artificially high sampling rate associated with oversampling creates a substantial separation between the desired frequency band and the undesired neighboring frequency band. An exemplary over-sampled bitstream DAC 200b which is commonly used today is discussed next with respect to FIG. 2C (PRIOR ART).

Figure 2C:
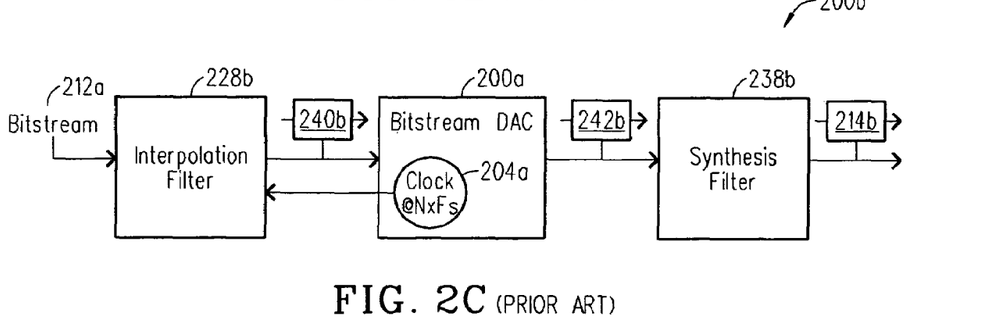

FIG. 2C (PRIOR ART) illustrates an exemplary oversampled bitstream DAC 200b which includes an interpolation filter 228b, a bitstream DAC 200a and a synthesis filter 238b. The interpolation filter 228b upsamples the bitstream of the multimedia signal 212a. The clock 204a (which is associated with the bitstream DAC 200a) enables multimedia signal 212a to be upsampled by operating at a fast rate: N (oversampling rate)*F (normal rate). The bitstream DAC 200a converts the upsampled digital multimedia signal 240b into an upsampled analog multimedia signal 242b. The synthesis filter 238b (which is the reverse shape of the interpolation filter 228b) downsamples the upsampled analog multimedia signal 242b and outputs an analog multimedia signal 214b. A detailed discussion about the over-sampled bitstream DAC 200b is not provided herein because this type of device is well known to those skilled in the industry.

A main problem associated with the over-sampled bitstream DAC 200b (and the regular bitstream DAC 200a) is that it is prone to limit cycle oscillations (especially those that employ a low order delta sigma modulator 202a). These limit cycle distortions are caused by the feedback and non-linearity of the sigma delta digital modulator 202a. And, they exhibit themselves as a periodic tone which is superimposed on the resulting analog signal 214b. This is not desirable. Plus, if the over-sampled bitstream DAC 200b happens to incorporate a higher order delta sigma modulator 202a then it could be difficult to stabilize which makes it difficult to achieve the desired signal-to-noise ratio (SNR).

Moreover, the over-sampled bitstream DAC 200b functions under the assumption that undesired noises, distortions, and other artifacts are randomly distributed across the entire dynamic range and across the entire frequency span of the multimedia signal. This is not desirable when processing a multimedia signal. Because, when the noise profile is highly focused on a particular dynamic range and frequency band, then oversampling can make things much worse by smearing it across the entire usable dynamic range and frequency band of the multimedia signal. This smearing effect often displays itself as jitter. One way to address this smearing effect is to utilize noise shaping which is a technique where random noise is added to the multimedia signal in an attempt to balance out the noise spectrum. However, the addition of noise to a pristine multimedia signal usually produces undesirable effects such as a lower SNR.

From the foregoing, it can be seen that the multi-bit DACs 100a and 100b and the bitstream DACs 200a and 200b each have problems which can adversely affect the quality of the conversion of a digital multimedia signal 104a and 212a into an analog multimedia signal 106a, 106b, 214a and 214b. And, these problems can lead to a decrease in the human perceptual quality of the resulting analog multimedia signal 106a, 106b, 214a and 214b. Thus, there is a need for a device that performs a digital-to-analog conversion on a multimedia signal in a manner which enhances the human perceptual quality of the resulting analog multimedia signal. This need and other needs are solved by the present invention.

BRIEF DESCRIPTION OF THE INVENTION

The present invention includes a device that performs a digital-to-analog conversion on a digital multimedia signal in a manner that enhances the human perceptual quality of the resulting analog multimedia signal (e.g., musical passage). In one embodiment, the device operates as follows: (1) divides the bitstream of a digital multimedia signal into several distinct multimedia bitstreams; (2) applies the most effective signal processing (filtering and noise shaping) to each distinct multimedia bitstream; (3) performs the most appropriate digital-to-analog conversion (using a multi-bit DAC, a bitstream DAC, an over-sampled bitstream DAC, or a hybrid of these DACs) to each distinct multimedia bitstream; and (4) combines all of the analog multimedia signals which are outputted by the DACs into a single analog multimedia signal.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

The human perception of a musical passage has an uneven sensitivity when it comes to distinguishing the different frequencies associated with a particular musical passage. For example, the human ear can discern high frequency signals within a musical passage with surprising quantitative accuracy. In particular, the human ear can readily discern the amplitudes/magnitudes of high frequency signals within a musical passage. But, the human ear can not readily discern the transient characteristics such as the phase and group delays in the high frequency signals of a musical passage. In contrast, the human ear can readily discern with very precise timing the transient characteristics in the low frequency signals of a musical passage. But, the human ear is far less sensitive to the amplitudes/magnitudes of the low frequency signals within a musical passage. Much of the same characteristics apply to human vision as well. For instance, black and white stimuli which correspond to motion typically elicits a very fast response from the eye, whereas colored stimulus elicits slower response but exacts more precision.

An investigation into multimedia signals also confirms this same trend. For example, the low frequency components in a musical passage, such as bass or mid-bass, have less resolution in dynamic range than the high frequency components. And, the high frequency components contain a far wider dispersion of jitter than their low frequency counterparts. In view of this, it is believed that by selectively/individually processing each of the various components of a digital multimedia signal (e.g., musical passage) then one could enhance the human perceptual quality of the resulting analog multimedia signal. A device 300 that selectively/individually processes each of the various components of a digital multimedia signal is described next with respect to FIG. 3.

Figure 3:
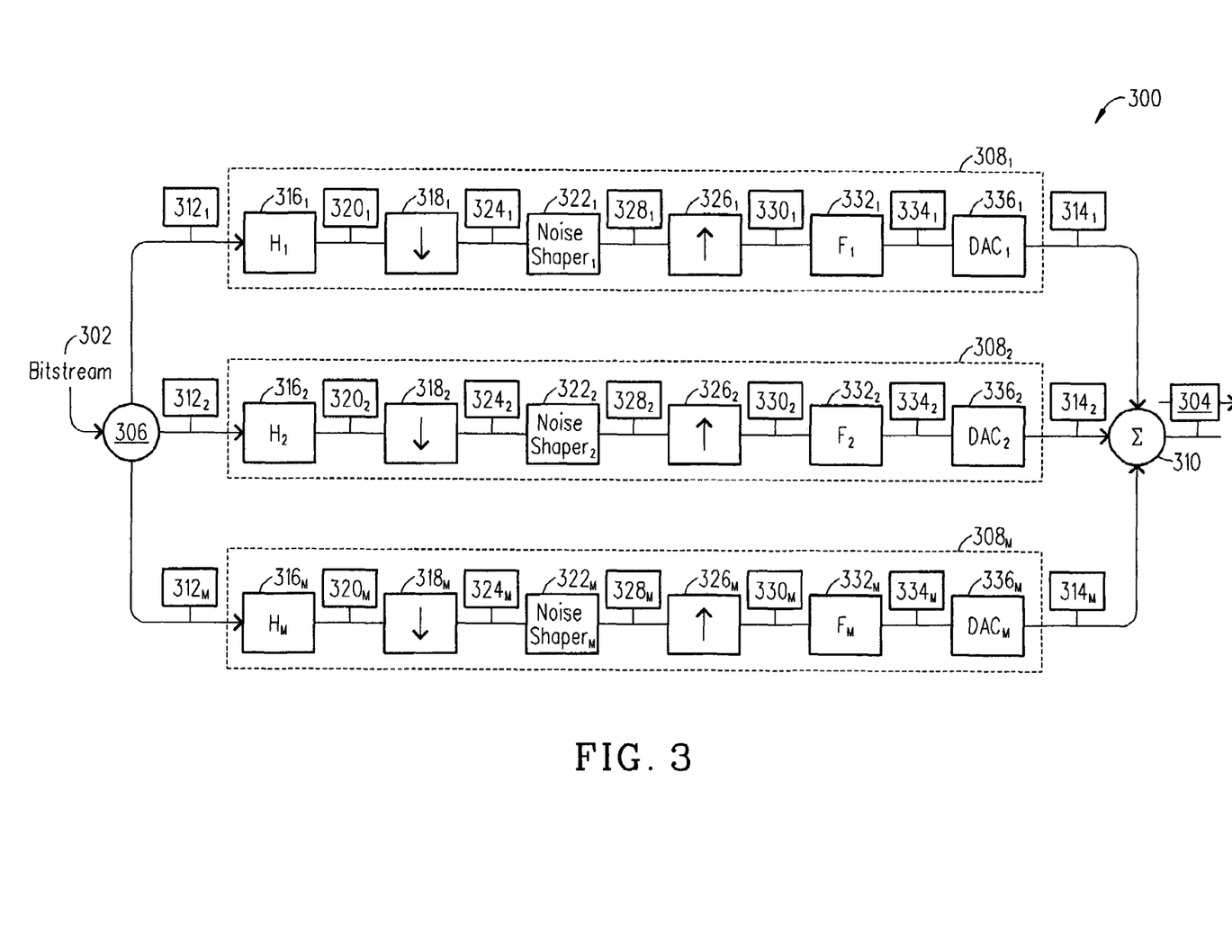
FIG. 3 is a block diagram of a device that performs a digital-to-analog conversion on a digital multimedia signal in a manner that enhances the human perceptual quality of the resulting analog multimedia signal in accordance with the present invention.
Figure 4:
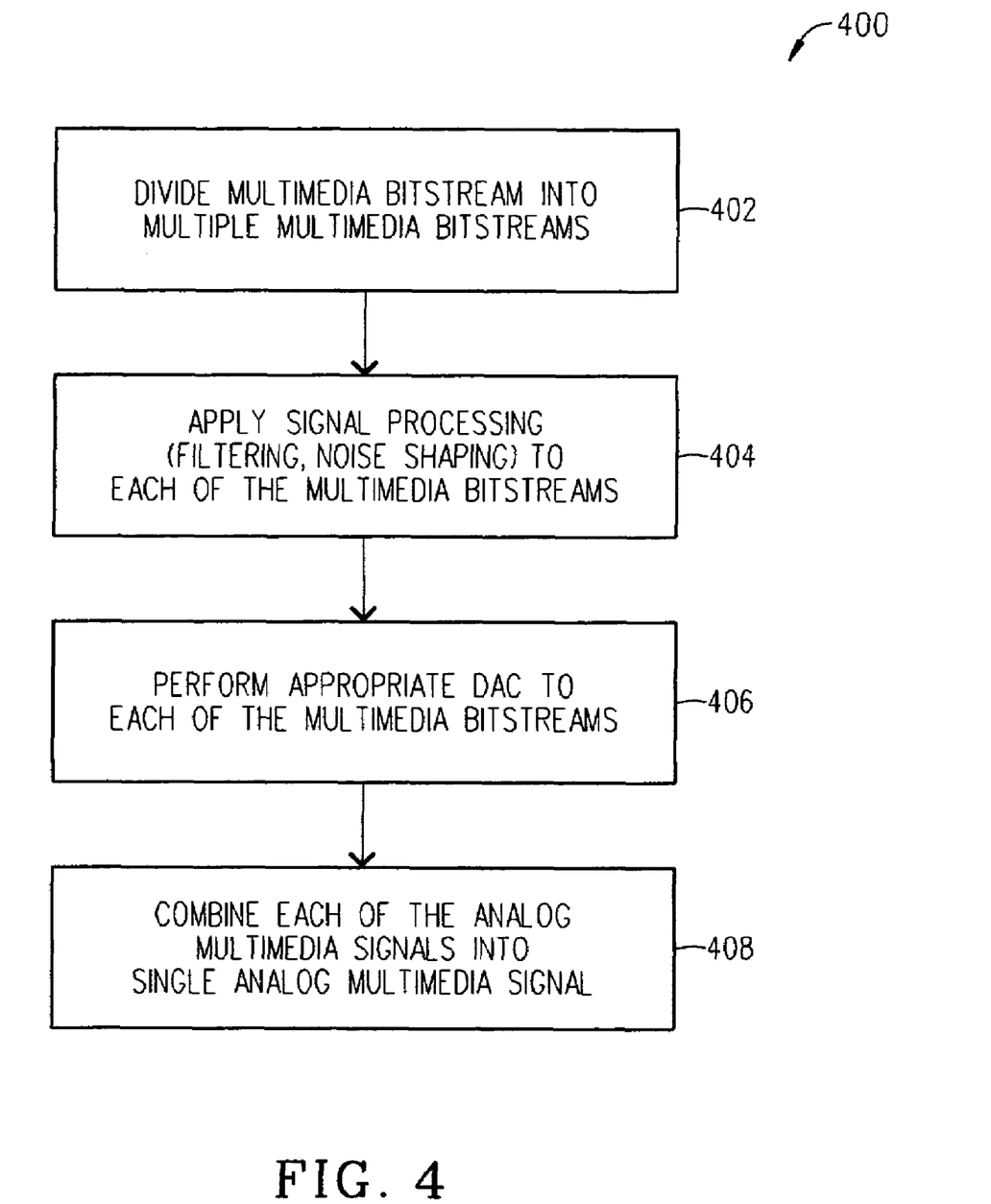
FIG. 4 is a flowchart of a method for performing a digital-to-analog conversion on a digital multimedia signal in a manner that enhances the human perceptual quality of the resulting analog multimedia signal in accordance with the present invention.

FIG. 3 is a block diagram of a device 300 that performs a digital-to-analog conversion on a digital multimedia signal 302 in a manner that enhances the human perceptual quality of the resulting analog multimedia signal 304. Basically, the device 300 would be used to replace the single DACs 100a, 100b, 200a, and 200b which are currently being used to perform a digital-to-analog conversion as shown in FIGS. 1-2 (PRIOR ART). And, the device 300 operates as follows: (1) divides the bitstream of the digital multimedia signal 302 into several distinct multimedia bitstreams $312_1$, $312_2$ and $312_M$ (see step 402 in FIG. 4); (2) applies the most effective signal processing (e.g., filtering and noise shaping) to each distinct multimedia bitstream $312_1$, $312_2$ and $312_M$ (see step 404 in FIG. 4); (3) performs the most appropriate digital-to-analog conversion (using a multi-bit DAC, a bitstream DAC, an over-sampled bitstream DAC, or a hybrid of these DACs) to each distinct multimedia bitstream $312_1$, $312_2$ and $312_M$ (see step 406 in FIG. 4); and (4) combines each of the converted analog signals $314_1$, $314_2$ and $314_M$ into a single analog signal 304 (see step 408 in FIG. 4).

As shown, the device 300 includes a splitter 306, multiple sub-band processing units $308_1$, $308_2$ and $308_M$ and a summer 310. The splitter 306 divides the bitstream of the digital multimedia signal 302 into multiple individual multimedia bitstreams $312_1$, $312_2$ and $312_M$. Each sub-band processing unit $308_1$, $308_2$ and $308_M$ processes and converts one of the individual multimedia bitstreams $312_1$, $312_2$ and $312_M$ into an individual multimedia analog signal $314_1$, $314_2$ and $314_M$. The summer 310 combines all of the individual multimedia analog signals $314_1$, $314_2$ and $314_M$ and then outputs a single analog multimedia signal 304. A detailed discussion is provided next about the various components that make-up the sub-band processing units $308_1$, $308_2$ and $308_M$.

Each sub-band processing unit $308_1$, $308_2$ and $308_M$ includes an analysis filter $316_1$, $316_2$ and $316_M$ which respectively filters one of the individual multimedia bitstreams $312_1$, $312_2$ and $312_M$. Then, a decimating unit $318_1$, $318_2$ and $318_M$ is used to decimate the respective filtered multimedia bitstream $320_1$, $320_2$ and $320_M$ which was outputted by the respective analysis filter $316_1$, $316_2$ and $316_M$. Thereafter, a noise shaper $322_1$, $322_2$ and $322_M$ applies a noise (if needed) to the respective decimated multimedia bitstream $324_1$, $324_2$ and $324_M$. For instance, the noise shaper $322_1$ can add a white noise to the decimated multimedia bitstream $324_1$ which happens to be associated with a high frequency audio/musical signal, e.g. a signal with maximum frequency component above 2.5 KHz. And, the noise shaper $322_2$ can add a pink noise (with a 1/f spectral distribution profile) or a brown noise (with Brownian motion profile) to the decimated multimedia bitstream $324_2$ which is associated with a medium frequency audio/musical signal, e.g. a signal with maximum frequency component below 2.5 KHz and minimum frequency component above 100 Hz. Plus, the noise shaper $322_M$ does not need to add any noise to the decimated multimedia bitstream $324_M$ which is associated with a low frequency audio/musical signal, e.g. a signal with frequency below 100 Hz. At the low frequencies, the noise shaper $322_M$ does not need to apply any noise shaping, because, noise shaping does not affect the magnitude of a low frequency signal where most of the signal energy is concentrated.

After the noise shaping, an interpolation filter $326_1$, $326_2$ and $326_M$ upsamples the respective noised shaped multimedia bitstream $328_1$, $328_2$ and $328_M$ and feeds the respective upsampled multimedia bitstream $330_1$, $330_2$ and $330_M$ into a respective synthesis filter $332_1$, $332_2$ and $332_M$. Each synthesis filter $332_1$, $332_2$ and $332_M$ functions like an inverse of the respective analysis filter $316_1$, $316_2$ and $316_M$ and outputs a multimedia bitstream $334_1$, $334_2$ and $334_M$ which has the proper sampling rate. Then, each filtered multimedia bitstream $334_1$, $334_2$ and $334_M$ is feed into a respective DAC $336_1$, $336_2$ and $336_M$ which converts the respective multimedia bitstream $334_1$, $334_2$ and $334_M$ into an individual analog multimedia signal $314_1$, $314_2$ and $314_M$. Finally, the summer 310 (e.g., parallel resistors, summing amplifier) combines all of the individual analog multimedia signals $314_1$, $314_2$ and $314_M$ and outputs the enhanced analog multimedia signal 304.

An advantage of this architecture is that one can select the most advantageous type of DAC $336_1$, $336_2$ and $336_M$ to process a corresponding multimedia bitstream $334_1$, $334_2$ and $334_M$. This selectively enables one to improve the perceived quality of the resulting analog multimedia signal 304 so it will be attuned to the sensitivity of human perceptual mechanisms. For instance, if the noise shaper $322_1$ adds white noise to the decimated multimedia bitstream $324_1$ which is associated with a high frequency audio/musical signal, then the preferred DAC $336_1$ to use would be an over-sampled bitstream DAC $336_1$ (see FIGS. 2A-2C). In this situation, the over-sampled bitstream DAC $336_1$ should have a relatively high order sigma delta modulator which can potentially create a lot of jitter because the human ear is not sensitive to jitter in a high frequency audio/musical signal. Again, the human ear is sensitive to the amplitude/magnitude in a high frequency audio/musical signal.

If the noise shaper $322_2$ adds pink/brown noise to the decimated multimedia bitstream $324_2$ which is associated with a medium frequency audio/musical signal, then the preferred DAC $336_2$ to use would be an over-sampled bitstream DAC $450_2$ (see FIGS. 2A-2C). In this situation, the over-sampled bitstream DAC $336_2$ should have a relatively low order sigma delta modulator which creates some but not a lot of jitter because the human ear is somewhat sensitive to jitter within a medium frequency audio/musical signal. And, if the noise shaper $322_M$ does not add noise to the decimated multimedia bitstream $324_M$ which is associated with a low frequency audio/musical signal, then the preferred DAC $336_M$ to use would be a multi-bit DAC $336_M$ (see FIGS. 1A-1B). This is done because the multi-bit DAC $336_M$ does not create much jitter which is good in this situation since the human ear is very sensitive to jitter that is located in a low frequency audio/musical signal. As can be seen, the ability to select the specific type of DAC $336_1$, $336_2$ and $336_M$ enables one to trade bit accuracy against jitter tolerance at each and every frequency band of interest within a digital multimedia signal 302. And, this enables one to enhance the human perceptual quality of the resulting analog multimedia signal 304.

From the foregoing, it can be appreciated that the present invention does not attempt to confront the problems which are associated with the individual multi-bit DACs 100a and 100b and the individual bitstream DACs 200a and 200b (see FIGS. 1-2). Instead, the present invention attempts mitigate the effects of these problems by redistributing them within a filter bank type architecture and then selecting the most advantageous type of DAC to process each individual region such that the analog version of the audio signal is properly attuned to the sensitivity of the human ear. This selective processing overcomes the disadvantage of applying noise shaping to the entire audible range of the audio signal which can degrade the overall perceptual quality of the resulting analog audio signal. Of course, even though the device 300 was described herein a selectively processing an audio multimedia signal it should be appreciated that the device 300 could also be used to selectively process a video multimedia signal.

Although one embodiment of the present invention has been illustrated in the accompanying Drawings and described in the foregoing Detailed Description, it should be understood that the present invention is not limited to the embodiment disclosed, but is capable of numerous rearrangements, modifications and substitutions without departing from the spirit of the invention as set forth and defined by the following claims.

What is claimed is:

1. A device for performing a digital-to-analog conversion to enhance a perceptual quality of a multimedia signal, said device comprising:
   a splitter for dividing the multimedia signal into a plurality of respective individual multimedia bitstreams based on respective associated frequency sub-bands;
   a plurality of sub-band processing units, each respective one of the sub-band processing units for processing and converting one of the respective individual multimedia bitstreams into an individual multimedia analog signal;

each respective sub-band processing unit for selectively adding a type of noise and using a type of digital-to-analog converter responsive to the respective frequency sub-band that is associated with the respective individual multimedia bitstream; and a summer for combining each of the individual multimedia analog signals and outputting a single multimedia analog signal.

2. The device of claim 1, wherein each respective sub-band processing unit adds noise if the respective associated frequency sub-band comprises a high frequency or a medium frequency.

3. The device of claim 2, wherein said noise includes a white noise, a pink noise or a brown noise.

4. The device of claim 1, wherein each respective sub-band processing unit does not add noise if the respective associated frequency sub-band comprises a low frequency.

5. The device of claim 1, wherein each respective sub-band processing unit includes a digital-to-analog converter (DAC); and wherein said DAC is selected to be a type that is either a multi-bit DAC, a bitstream DAC, an over-sampled bitstream DAC or a hybrid DAC.

6. The device of claim 1, wherein each respective sub-band processing unit includes:
   an analysis filter;
   a decimating unit;
   a noise shaping unit for selectively adding said type of noise responsive to the respective frequency sub-band that is associated with the respective individual multimedia bitstream;
   an interpolation filter;
   a synthesis filter; and
   a digital-to-analog converter (DAC) having said type of DAC that is selected responsive to the respective frequency sub-band that is associated with the respective individual multimedia bitstream.

7. The device of claim 6, wherein when said respective individual multimedia bitstream is associated with a high frequency audio signal then said noise shaping unit adds white noise to said respective individual multimedia bitstream and said DAC is an over-sampled bit-stream DAC.

8. The device of claim 6, wherein when said respective individual multimedia bitstream is associated with a medium frequency audio signal then said noise shaping unit adds pink noise to said respective individual multimedia bitstream and said DAC is an over-sampled bit-stream DAC.

9. The device of claim 6, wherein when said respective individual multimedia bitstream is associated with a medium frequency audio signal then said noise shaping unit adds brown noise to said respective individual multimedia bitstream and said DAC is an over-sampled bit-stream DAC.

10. The device of claim 6, wherein when said respective individual multimedia bitstream is associated with a low frequency audio signal then said noise shaping unit does not add noise to said respective individual multimedia bitstream and said DAC is a multi-bit DAC.

11. A method for enhancing a perceptual quality of a multimedia signal, said method comprising the steps of:
   dividing the multimedia signal into a plurality of respective multimedia bitstreams based on respective associated frequency sub-bands;
   individually processing each of the multimedia bitstreams including selectively adding a type of noise responsive to the respective frequency sub-band that is associated with each respective multimedia bitstream;
   individually converting each of the multimedia bitstreams into an analog signal using a type of digital-to-analog converter that is selected responsive to the respective frequency sub-band that is associated with each respective multimedia bitstream; and
   combining each of the analog signals to form a single analog multimedia signal.

12. The method of claim 11, wherein each individual processing step further includes:
   filtering one of the multimedia bitstreams;
   wherein said noise is not added if said respective multimedia bitstream is associated with a low frequency audio signal.

13. The method of claim 12, wherein said noise is added if said respective multimedia bitstream is associated with a high frequency audio signal, said type of noise comprising white noise.

14. The method of claim 12, wherein said noise is added if said respective multimedia bitstream is associated with a medium frequency audio signal, said type of noise comprising pink noise.

15. The method of claim 12, wherein said noise is added if said respective multimedia bitstream is associated with a medium frequency audio signal, said type of noise comprising brown noise.

16. The method of claim 11, wherein said selected type of digital-to-analog converter (DAC) comprises an over-sampled bitstream DAC to convert the respective multimedia bitstream into one of the analog signals when the respective multimedia bitstream is associated with a respective frequency sub-band having a high frequency or a medium frequency.

17. The method of claim 11, wherein said selected type of digital-to-analog converter (DAC) comprises a multi-bit DAC to convert the respective multimedia bitstream into one of the analog signals when the respective multimedia bitstream is associated with a respective frequency sub-band having a low frequency.

18. A device for performing a digital-to-analog conversion to enhance a perceptual quality of a multimedia signal, said device comprising:
   a splitter for dividing the multimedia signal into a plurality of respective individual multimedia bitstreams based on respective associated frequency sub-bands;
   a first sub-band processing unit for processing and converting one of the respective individual multimedia bitstreams into an individual multimedia analog signal, the first sub-band processing unit associated with a first frequency sub-band; the first sub-band processing unit including a first noise shaper for adding a first type of noise responsive to the first frequency sub-band; the first sub-band processing unit including a first digital-to-analog converter of a first type that is selected responsive to the first frequency sub-band;
   a second sub-band processing unit for processing and converting one of the respective individual multimedia bitstreams into an individual multimedia analog signal, the second sub-band processing unit associated with a second frequency sub-band; the second sub-band processing unit including a second noise shaper for adding a second type of noise responsive to the second frequency sub-band; the second sub-band processing unit including a second digital-to-analog converter of a second type that is selected responsive to the second frequency sub-band;
   a third sub-band processing unit for processing and converting one of the respective individual multimedia bitstreams into an individual multimedia analog signal, the third sub-band processing unit associated with a third frequency sub-band; the third sub-band processing unit including a third digital-to-analog converter of a third type that is selected responsive to the third frequency sub-band; and a summer for combining each of the individual multimedia analog signals and outputting a single multimedia analog signal.

19. The device of claim 18, wherein said first frequency sub-band corresponds to a high frequency, said first type of noise comprises a white noise, and said first type of digital-to-analog converter (DAC) comprises an over-sampled bitstream DAC; wherein said second frequency sub-band corresponds to a medium frequency, said second type of noise comprises a pink noise, and said second type of DAC comprises an over-sampled bitstream DAC; and wherein said third frequency sub-band corresponds to a low frequency and said third type of DAC comprises a multi-bit DAC.

20. The device of claim 18, wherein said first frequency sub-band corresponds to a high frequency, said first type of noise comprises a white noise, and said first type of digital-to-analog converter (DAC) comprises an over-sampled bitstream DAC; wherein said second frequency sub-band corresponds to a medium frequency, said second type of noise comprises a brown noise, and said second type of DAC comprises an over-sampled bitstream DAC; and wherein said third frequency sub-band corresponds to a low frequency and said third type of DAC comprises a multi-bit DAC.

* * * * *

UNITED STATES PATENT AND TRADEMARK OFFICE
CERTIFICATE OF CORRECTION

| | |
|---|---|
| PATENT NO. | : 7,633,417 B1 |
| APPLICATION NO. | : 11/445864 |
| DATED | : December 15, 2009 |
| INVENTOR(S) | : Chiang Yeh |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 747 days.

Signed and Sealed this

Twenty-first Day of December, 2010

David J. Kappos
*Director of the United States Patent and Trademark Office*